(12) United States Patent
Jang

(10) Patent No.: US 7,863,684 B2
(45) Date of Patent: Jan. 4, 2011

(54) HIGH INTEGRATED SEMICONDUCTOR MEMORY DEVICE

(75) Inventor: Tae Su Jang, Gwacheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 66 days.

(21) Appl. No.: 12/344,700

(22) Filed: Dec. 29, 2008

(65) Prior Publication Data

US 2010/0006938 A1 Jan. 14, 2010

(30) Foreign Application Priority Data

Jul. 14, 2008 (KR) ...................... 10-2008-0068128

(51) Int. Cl.
*H01L 27/12* (2006.01)
*H01L 27/108* (2006.01)
*H01L 29/94* (2006.01)

(52) U.S. Cl. ................ 257/347; 257/296; 257/E27.084
(58) Field of Classification Search ........................ None
See application file for complete search history.

(56) References Cited

U.S. PATENT DOCUMENTS 7,075,152 B2 * 7/2006 Ohsawa ...................... 257/347

2005/0179073 A1 * 8/2005 Lee et al. ..................... 257/296
2006/0118849 A1 * 6/2006 Hidaka et al. ............... 257/296

FOREIGN PATENT DOCUMENTS

KR 10-2002-0065353 8/2002

OTHER PUBLICATIONS

Ranica et al., "A capacitor-less DRAM cell on 75nm gate length, 16nm thin Fully Depleted SOI device for high density embedded memories," IEDM Technical Digest, Dec. 2004, pp. 277-280.

* cited by examiner

*Primary Examiner*—Julio J Maldonado
*Assistant Examiner*—Shaka Scarlett
(74) *Attorney, Agent, or Firm*—Marshall, Gerstein & Borun LLP

(57) ABSTRACT

Disclosed herein is a semiconductor memory device including plural unit cells, each constituted with a floating body transistor without any capacitor, to prevent data distortion and data crash in the unit cell. A semiconductor memory device comprises plural active regions and a device isolation layer for separating each active region from each others, wherein the plural active regions stand in row and column lines.

14 Claims, 5 Drawing Sheets

| Cell | Gate | Drain | Source | Remark |
|---|---|---|---|---|
| A | 0.8V | 1.6V | 0V | Write1 |
| B | 0V | 1.6V | 0V | DISTORTION |
| C | 0.8V | 0V | 0V | PERMISSIBLE |
| D | 0V | 0V | 0V | Hold |

| Cell | Gate | Drain | Source | Remark |
|---|---|---|---|---|
| A | 0.8V | -0.8V | 0V | Write0 |
| B | 0V (0.8V) | -0.8V (0V) | 0V (0.8V) | DISTORTION |
| C | 0.8V | 0V | 0V | PERMISSIBLE |
| D | 0V | 0V | 0V | Hold |

| Cell | Gate | Drain | Source | Remark |
|------|------|-------|--------|--------|
| A | 0.8V | 1.6V | 0V | Write1 |
| B | 0V | 1.6V | 0.4V | PERMISSIBLE |
| C | 0.8V | 0V | 0V | PERMISSIBLE |
| D | 0V | 0V | 0.4V | PERMISSIBLE |

| Cell | Gate | Drain | Source | Remark |
|------|------|-------|--------|--------|
| A | 0.8V | -0.8V | 0V | Write0 |
| B | 0V (0.8V) | -0.8V (0V) | -0.4V (0.8V) | PERMISSIBLE |
| C | 0.8V | 0V | 0V | PERMISSIBLE |
| D | 0V | 0V | -0.4V | PERMISSIBLE |

HIGH INTEGRATED SEMICONDUCTOR MEMORY DEVICE

CROSS-REFERENCE TO RELATED APPLICATION

Priority is claimed to Korean patent application number 10-2008-0068128, filed on Jul. 14, 2008, which are incorporated by reference in its entirety.

BACKGROUND OF THE INVENTION

The invention relates generally to a method for fabricating a semiconductor device and, more specifically, to a technology of forming a floating body transistor used in a highly-integrated semiconductor device using a silicon-on-insulator (SOI) structure.

In many semiconductor device systems, a semiconductor memory device is configured to store data generated or processed in the device. For example, if a request from a data processor such as a central processing unit (CPU) is received, a semiconductor memory device may output data to the data processor from unit cells in the device, or the device may store data processed by the data processor to unit cells of an address transmitted with the request.

Although data storage capacity of semiconductor memory device has increased, the size of semiconductor memory device has not increased proportionally because various elements and components used for read or write operations in a semiconductor memory device have reduced in size. Accordingly, components and elements unnecessarily duplicated in the semiconductor memory device, such as transistors or wires, are combined or merged to decrease the area occupied by each component. Particularly, the reduction of the size of unit cells included in the semiconductor memory device affects improvement of the degree of integration.

As an example of a semiconductor memory device, Dynamic Random Access Memory (DRAM) is a type of volatile memory device configured to retain data while a power source is supplied. The unit cell comprises a transistor and a capacitor. In the case of the unit cell having a capacitor, after the datum "1" is delivered to the capacitor, charges that are temporarily stored in the storage node are dissipated, i.e., the amount of the charge stored therein is reduced, because of both leakage currents generated at junction of the storage nodes and inherent characteristics of the capacitor. As a result, a refresh operation is periodically required on the unit cells so that data stored in the DRAM cannot be destroyed.

In order to prevent the reduction of charge, numerous methods for increasing capacitance (Cs) of the capacitor included in the unit cell have been suggested so that more charges may be stored in the storage node. For example, an insulating film used in a conventional capacitor, e.g., an oxide film, may be replaced with an advanced insulating film which has a larger dielectric constant, such as a nitrified oxide film or a high dielectric film. Otherwise, a capacitor having a two-dimensional structure is replaced with a three-dimensional cylindrical structure or a trench structure, thereby increasing the surface area of both electrodes of the capacitor.

As the design rule is reduced, the plane area where a capacitor can be positioned is reduced, and it is difficult to develop materials constituting an insulating film in the capacitor. As a result, the junction resistance value of the storage node SN and the turn-on resistance value of the transistor in the unit cell are larger, and accordingly it is difficult to perform normal read and write operations, and refresh characteristics deteriorate.

To improve the above-described shortcomings, the unit cell may comprise a transistor having a floating body. Thus, the unit cell of the semiconductor memory device does not include a capacitor used for storing data, but stores data in a floating body of the transistor included in the unit cell.

FIG. 1 is a cross-sectional diagram showing a method for storing a datum "1" in a conventional floating body transistor.

As shown, the floating body transistor is formed on a silicon-on-insulator (SOI) substrate that includes a bottom semiconductor layer 110, a buried insulating layer 120, and an upper silicon layer 130. A gate pattern 140 is formed on an active region defined on the upper silicon layer 130, and source and drain of the floating body transistor is formed by injecting a dopant into both sides of the gate pattern 140 in the upper silicon layer 130 through an ion-implantation process.

When the datum "1" is delivered through a bit line BL, a positive voltage is supplied to gate and drain of the floating body transistor ($V_G>0$, $V_D>0$) and a ground voltage GND (0V) is supplied to source of the floating body transistor. In order to store data in the floating body, a voltage level supplied on the word line is reduced by ½ or ⅓ of the voltage level applied to the bit line connected to one active region of the transistor, thereby generating hot carriers. Accordingly, a large amount of hot carriers are generated at a junction region of the bit line BL. Then, electrons are sent out into the bit line BL but holes remain in the floating body FB.

FIG. 2 is a cross-sectional diagram showing a method for storing a datum "0" in the conventional floating body transistor.

As shown, a negative voltage is supplied to the drain of the floating body transistor when the datum "0" is delivered ($V_D<0$). At this time, voltage levels supplied with the gate and the source of the floating body transistor are same as the levels when the datum "1" is delivered. However, because of the negative voltage when the datum "0" is delivered, the hot carriers are not generated in the junction region, so that holes do not remain in the floating body FB.

Referring to FIGS. 1 and 2, amount of holes stored in the floating body FB is changed according to voltage level supplied to the drain of the floating body transistor through the bit line. The holes kept in the floating body lower the threshold voltage of the transistor of the unit cell; as a result, the amount of current flowing through the transistor increases. That is, the amount of current flowing when the holes are stored in the floating body of the transistor is larger than that flowing when no holes are stored. As a result, it is possible to distinguish whether the datum "1" or "0" is stored in the unit cell. That is, the unit cell can store the datum without any capacitor.

FIG. 3 is a layout and cross-sectional diagram illustrating a cell array configured as a floating body cell transistor in a general semiconductor memory device. As shown in FIG. 3, the cell array comprises a line-type active region 332, a bit line 360 over an active region, a source line 350 positioned at an intersection with the active region 332, and a word line 342. The semiconductor memory device including the floating body cell transistor is fabricated by using not a silicon bulk substrate but a SOI substrate that includes a bottom semiconductor substrate (not shown), a buried insulating film 320 and a top silicon layer 330.

In detailed, the line-type active region 332 is formed over the top silicon layer 330. A gate pattern 340 includes the word line 342 formed at the intersection with the active region. The cell array comprises a source line contact 352, a bit line contact 362, the gate pattern 340, and an interlayer insulating film 370 for electrically isolating the source line contact 352 and the bit line contact 362. The source line contact 352 and the bit line contact 362 are configured to respectively connect each of the source line 350 and the bit line 360, which are located between the gate patterns 340 that include the word line 342, to the active region 332 where the source and drain regions of the floating body cell transistor are located.

FIG. 4 is a circuit diagram illustrating an equalizing circuit of the cell array of FIG. 3.

As shown, neighboring floating body cell transistors A and B which are included as a unit cell in the cell array is connected to the same source line SL0 which is corresponded to the source line 350 shown in FIG. 3, and are respectively connected to different bit lines BL0 and BL1 which are matched with the bit lines 360 connected to the silicon layer 330 through the different bit line contacts 362.

As mentioned above, the cell array including the floating body cell transistor that shares the source line 350 over the line-type active region 332 may have an advantage of decreasing a chip size and simplifying the manufacturing process. However, when the unit cell where datum is delivered shares the source line 350 with the neighboring other unit cell, storing the datum in the unit cell the neighboring unit cell can have a bad effect to the other neighboring unit cell. That is, storing data in the unit cell can distort or destroy a datum already stored in the neighboring other unit cell. If the datum in the neighboring other unit cell is distorted, it is impossible to guarantee stable operations of the semiconductor memory device.

FIG. 5 is a table illustrating a write operation of the cell array of FIG. 4.

As shown, when data "1" and "0" are stored in a first unit cell A, a data error occurs in a second unit cell B as shown in FIG. 5.

In detail, in order to store the data "1" in the first unit cell A, a voltage of 0.8V is applied to a word line WL0, and a voltage of 1.6V is applied to a drain connected to a bit line BL0. Although the voltage of 0.8V is applied to a gate of the floating body cell transistor in a third unit cell C connected to the first unit cell A through the same word line WL0, no signal is delivered to a bit line BL1. In case of the third unit cell C, the data stored in a floating body are not affected because there is no voltage difference between the source and the drain although a voltage is applied to the gate.

In case of the second unit cell B being connected to the first unit cell A through the same bit line BL0 and the same source line SL0, although a voltage is not applied to the gate, a voltage difference is generated between the drain connected to the bit line BL0 and the source connected to the source line SL0. Although a voltage is not applied to a gate of the second unit cell B, a retention time of the data stored in the floating body is reduced by the voltage difference between the drain and the source. The reduction phenomenon of the retention time is sufficiently described in the International Academic Paper ("A capacitor-less DRAM cell on 75 nm gate length, 16 nm thin fully depleted SOI device for high density embedded memories," Ranica, R. et al., Electron Devices meeting, 2004. IEDM Technical Digest. IEEE International Volume, Issue, 13-15 Dec. 2004. pp. 277-280).

In similar way, when the data "0" is stored in the first unit cell A, the voltage of 0.8V is applied to the gate, and a voltage of −0.8V is applied to the drain connected to the bit line BL0. Since the source line SL0 maintains a voltage of 0V, holes stored in the floating body are removed by a potential difference generated between the source and the drain. However, a relative potential difference is generated in the gate and the source although the voltage of −0.8V is applied only to the drain through the same bit line BL0. Referring to FIG. 5, if the drain of the second unit cell B to receive the voltage of −0.8V is 0V, the same effect as when 0.8V is applied to the source and the gate of the second unit cell B occurs. As a result, hot carriers are generated in the second unit cell B so that a data value stored in the second unit cell B may be changed.

As above described, in a semiconductor memory device having the conventional structure of a cell array including a unit cell configured as a floating body cell transistor over a SOI substrate, the data may be changed or destroyed in a neighboring unit cell whenever data are delivered and stored in a specific unit cell. As a result, the operation stability of the semiconductor memory device including the unit cell configured as the floating body cell transistor is degraded.

BRIEF SUMMARY OF THE INVENTION

Various embodiments of the present invention are directed to providing a cell stricture and a cell region layout for use in a semiconductor memory device including plural unit cells having a floating body transistor without any capacitor in order to prevent data distortion and data crash in the unit cell when a neighboring unit cell is accessed in response to read/write operation.

According to an embodiment of the present invention, a semiconductor memory device comprises plural active regions and a device isolation layer for separating each of the plural active regions from others, wherein the plural active regions stand in row and column lines.

Preferably, each of the plural active regions includes two unit cells which hold a drain coupled to a bit line in common and sources of the two unit cells are respectively coupled to different source lines.

Preferably, the source lines are formed in the direction of a minor axis of the active region and the bit line is formed over the source lines in the direction of a major axis of the active region.

Preferably, the bit line is formed in the direction of a major axis of the active region and the source lines are formed over the bit line in the direction of a minor axis of the active region.

Preferably, if data is stored in one of the two unit cells, a voltage is supplied to one of the source lines coupled to the other of the two unit cells.

Preferably, a predetermined level of the voltage is higher than a ground voltage and lower than a threshold voltage of the unit cell when the datum "1" is delivered through the bit line.

Preferably, a predetermined level of the voltage is lower than a ground voltage and higher than a negative level of threshold voltage when the datum "0" is delivered through the bit line.

Preferably, each unit cell consists of a floating body transistor including a gate formed on the active region and source and drain formed in the active region through an ion-implantation process.

Preferably, the active region is formed in an upper silicon layer included in a silicon-on-insulator substrate, and the device isolation layer is connected to a buried insulating layer included in the silicon-on-insulator substrate.

Preferably, the unit cell has an area of 6F2, where the F is the minimum width under a design rule.

Preferably, the semiconductor memory device further comprises a dummy word line between two neighboring active regions in the direction of a major axis of the active region.

BRIEF DESCRIPTION OF THE DRAWINGS

FIG. 4 is a circuit diagram illustrating an equalizing circuit of the cell array of FIG. 3.

DESCRIPTION OF EMBODIMENTS

The present invention will be described in more detail with reference to the accompanying drawings.

Figure 6:
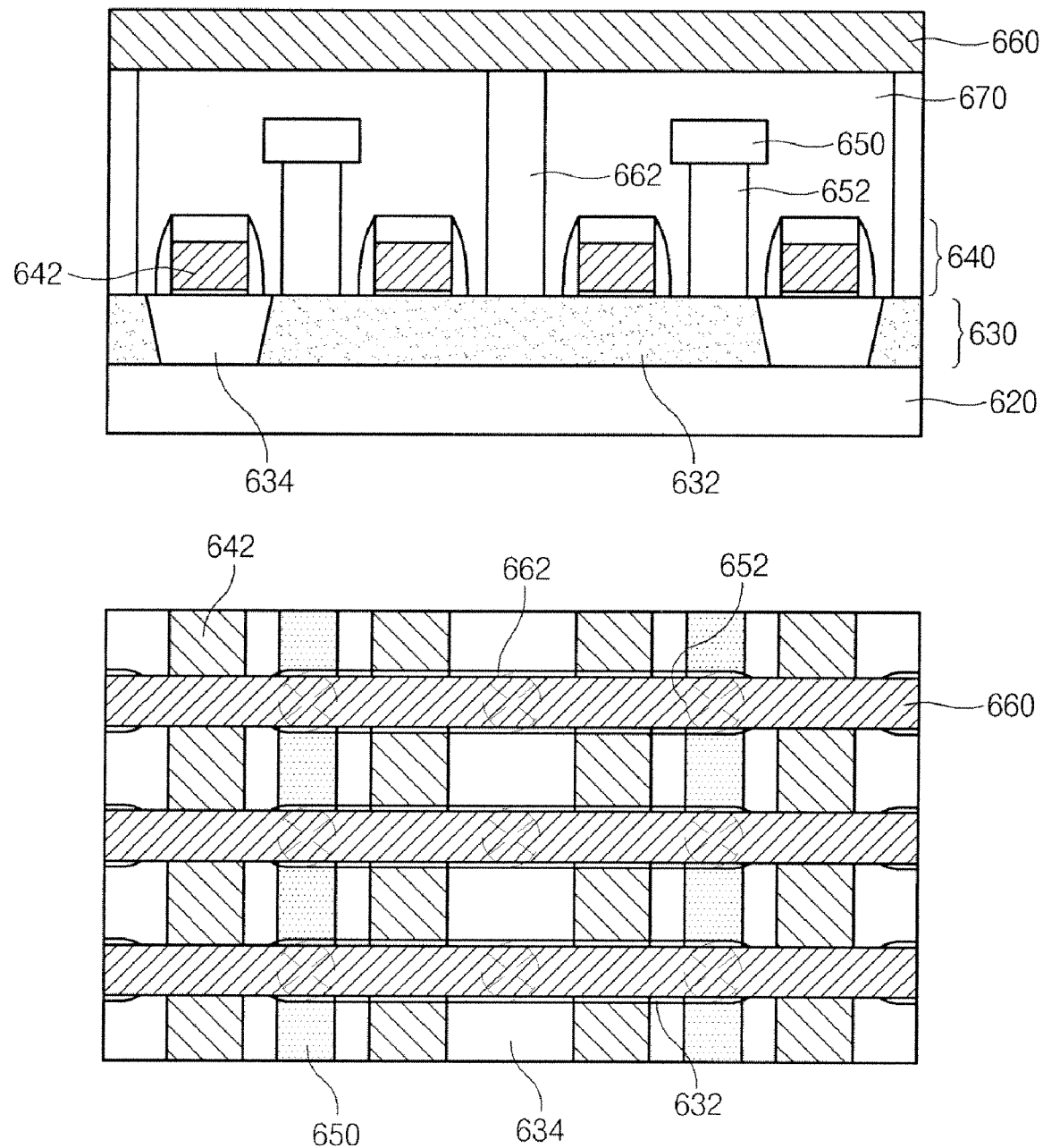
FIG. 6 is a layout and cross-sectional diagram illustrating a cell array configured as a floating body cell transistor in a semiconductor memory device according to an embodiment of the present invention.

FIG. 6 is a layout and cross-sectional diagram illustrating a cell array configured as a floating body cell transistor in a semiconductor memory device according to an embodiment of the present invention.

Figure 1:
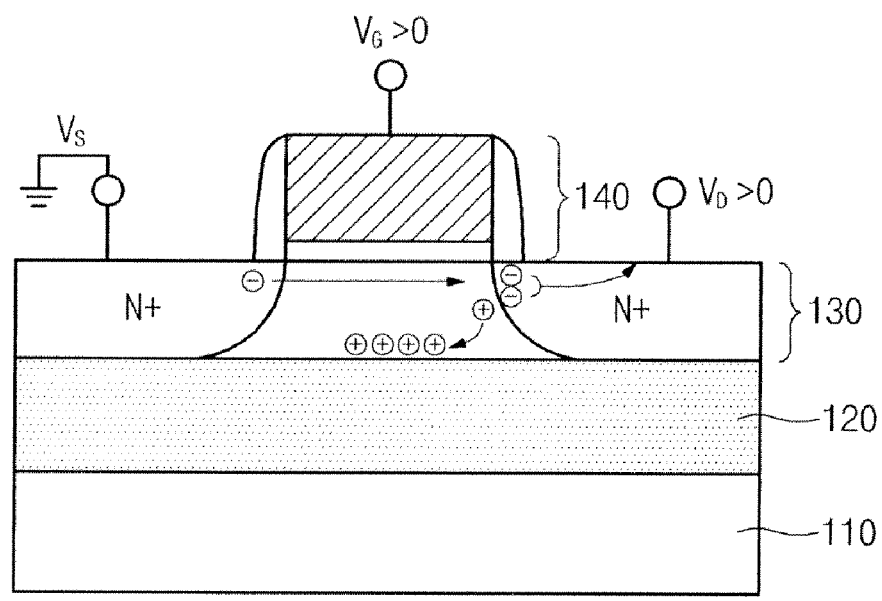
FIG. 1 is a cross-sectional diagram showing a method for storing a data "1" in a conventional floating body transistor.
Figure 2:
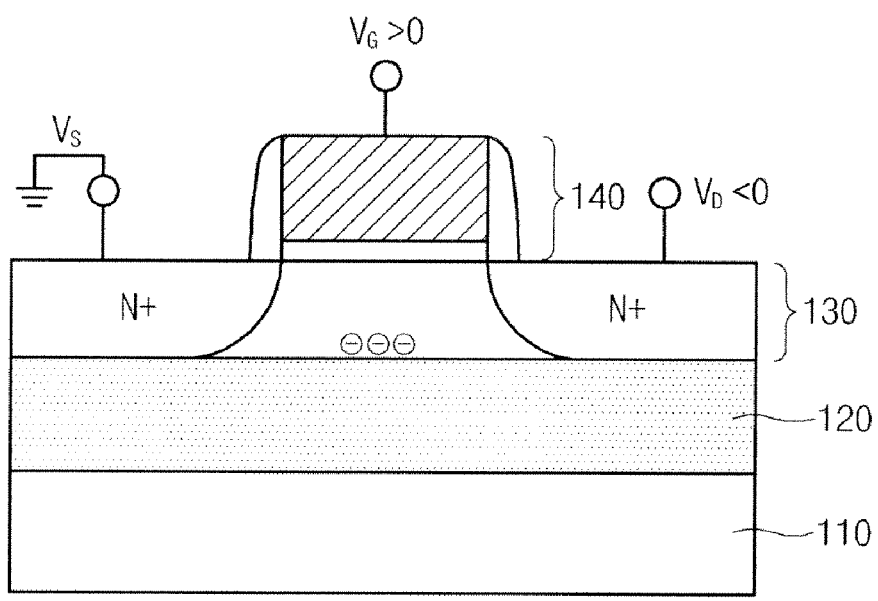
FIG. 2 is a cross-sectional diagram showing a method for storing a data "0" in the conventional floating body transistor.
Figure 3:
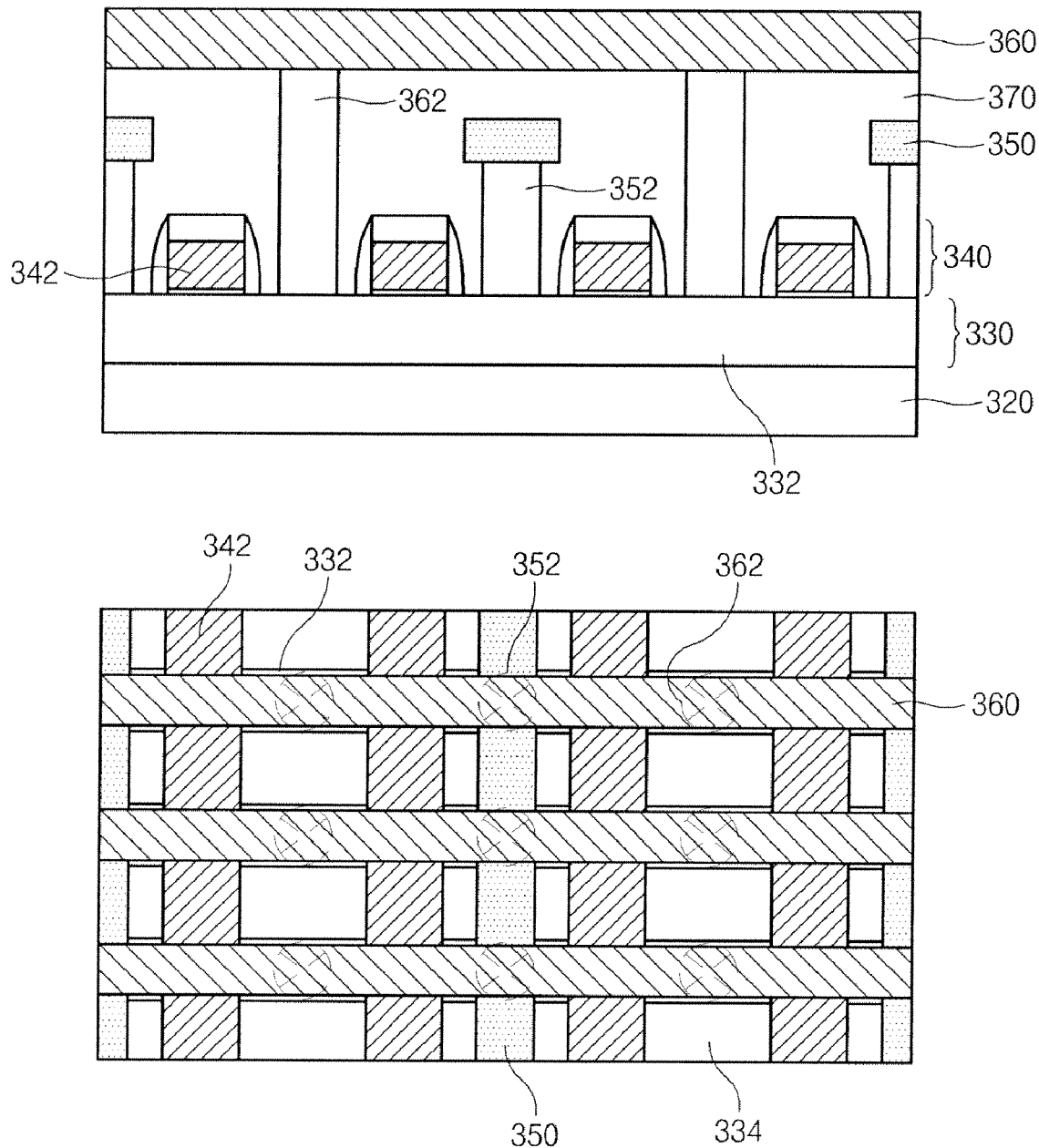
FIG. 3 is a layout and cross-sectional diagram illustrating a cell array configured as a floating body cell transistor in a general semiconductor memory device.
Figure 5:
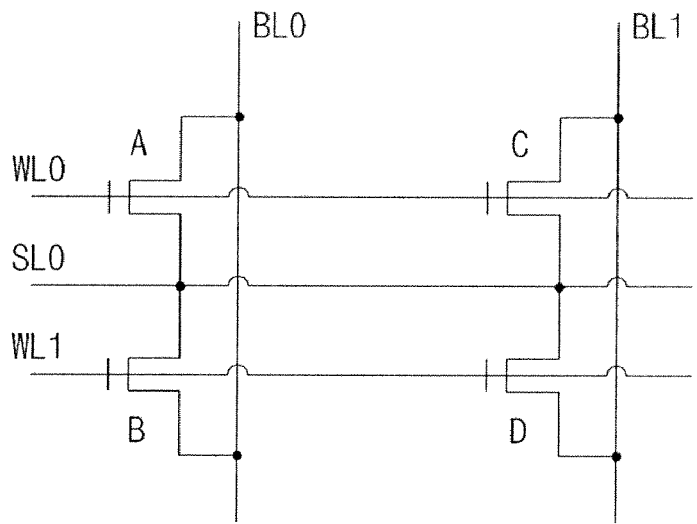
FIG. 5 is a table illustrating the operation of the cell array of FIG. 4.

Referring to FIG. 6, the cell array comprises an island-type active region 632, a bit line 660 formed over the island-type active region 632, a source line 650 and a word line 642 formed at an intersection with the island-type active region 632. In the conventional art shown in FIG. 3, each unit cell and neighboring unit cells shares source and drain regions; however, in the present invention shown in FIG. 6, the unit cell and the neighboring unit cell do not hold source region in common because the active region 632 is isolated by a device isolation film 634 formed through a shallow trench isolation (STI) process. The semiconductor memory device including a floating body cell transistor is formed over a SOI substrate that includes a bottom semiconductor substrate (not shown), a buried insulating film 620, and a top silicon layer 630.

Particularly, the island-type active region 632 and the device isolation film 634 for electric isolation are formed in the top silicon layer 630. The word line 642 positioned at an intersection with the active region is included in a gate pattern 640 formed over the active region 632. Also, the cell array comprises a source line contact 652, a bit line contact 662, the gate pattern 640, and an interlayer insulating film 670 for electrically isolating the source line contact 652, the bit line contact 662, and the gate pattern 640. The source line contact 652 and the bit line contact 662 are configured to connect the source line 650 and the bit line 660, which are located between the gate patterns 640 that include the word line 642, to the active region 632 where source/drain regions of the floating body cell transistor are formed. Unlike the conventional art, two unit cells are formed in one active region 632. The unit cells in the active region 632 share a drain region, and are connected to the shared drain region through the bit line contact 662 with the bit line 660. Each of the two unit cells includes a source region, and is connected to the individual source line 650 through the different source line contact 652.

Figures 7, 8:
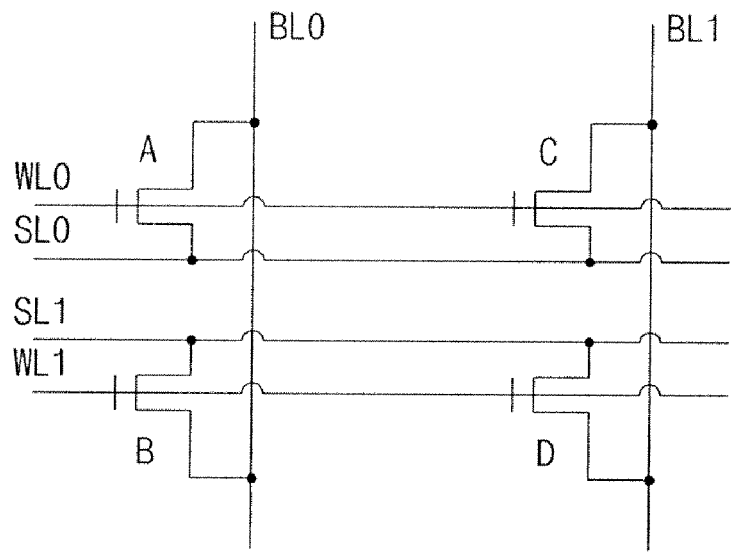
FIG. 7 is a circuit diagram illustrating an equalizing circuit of the cell array shown in FIG. 6.
FIG. 8 is a table illustrating the operation of the cell array of FIG. 7.

FIG. 7 is a circuit diagram illustrating an equalizing circuit of the cell array of FIG. 6.

As shown in FIG. 7, neighboring floating body cell transistors, i.e., first and second unit cells A and B, constituting a unit cell of the cell array share bit lines 660 and BL0 through one bit line contact 662, and are connected to source lines 650 and SL0 through different source line contact 652.

In the conventional art, when the unit cell where data is delivered shares the source line 650 with the other neighboring unit cells, the data storing process may affect the neighboring unit cell. In order to solve this problem, neighboring unit cells (A and B, or C and D) connected to the same bit line are connected to an individual source line in an embodiment of the present invention. On the other hand, the neighboring unit cells connected to the same word line are connected to the same source line.

FIG. 8 is a table illustrating the operation of the cell array of FIG. 7.

As shown in FIG. 8, data errors are shown to decrease in the second unit cell B when datum "1" and "0" are stored in the first unit cell A.

In detail, in order to store the datum "1" in the first unit cell A, a voltage of 0.8V is applied to a word line WL0, and a voltage of 1.6V is applied to a drain connected to a bit line BL0. Although the voltage of 0.8V is applied to a gate of the floating body cell transistor in a third unit cell C connected to the first unit cell A through the same word line WL0, no signal is delivered to a bit line BL1. In the case of the third unit cell C, the datum stored in a floating body is not affected because there is no voltage difference between the source and the drain although a voltage is applied to the gate.

In the case of the second unit cell B connected to the first unit cell A through the same bit line BL0, although a voltage is not applied to the gate, a voltage of 1.6V is applied to the drain connected to the bit line BL0, so that a voltage of 0.4 V is applied to a source line SL1 connected to the second unit cell B. As a voltage difference between the drain and the source in the first unit cell A becomes greater, hot carriers are generated to store holes. A given voltage is applied to the source line SL1 in the second unit cell B, thereby reducing the voltage difference between the drain and the source by 1.2V. As a result, data errors that may occur in the second unit cell B can be inhibited. A voltage applied to a source line SB1 connected to the second unit cell B reduces the voltage difference between the drain and the source where hot carriers do not occur. A voltage level is determined by the operating environment of the unit cell.

In the same way, when the data "0" is stored in the first unit cell A, a voltage of 0.8V is applied to the gate, and a voltage of −0.8V is applied to the drain connected to the bit line BL0. Since the source line SL0 maintains 0V, holes stored in the floating body are removed by a potential difference generated between the source and the drain. However, a voltage of −0.8V is applied only to the drain through the same bit line BL0 in the second unit cell B, so that a relative potential difference may be generated in the gate and the source. In order to prevent the potential difference, a voltage of −0.4V is applied to the source line SL1 connected to the source. Referring to FIG. 8, if the drain of the second unit cell B that receives a voltage of −0.8V is 0V, the same effect as when a potential of 0.8V is applied to the gate of the second unit cell B and a potential of 0.4V is applied to the source of the second unit cell B occurs. As a result, a voltage difference between the source and the drain of the second unit cell B is reduced, thereby inhibiting generation of hot carriers. When the data "0" is stored in the first unit cell A, a data value stored in the second unit cell B can be prevented from changing.

As mentioned above, the disclosed cell array in the semiconductor memory device does not share a source of the neighboring unit cell. When a datum is stored in one side of the neighboring unit cell, a random voltage is applied to a source line positioned at the other side, thereby preventing data errors. The random voltage applied to the source line can be adjusted by a voltage level of the data and features of the transistor. When a data "1" or "0" is stored in a specific unit cell in the embodiment of FIG. 8, 0.4V or −0.4V is applied to the source line connected to the neighboring unit cell, thereby reducing a voltage difference between the source and the drain of the neighboring unit cell by 1.2V or 0.4V so as to prevent generation of data errors.

As the random voltage is applied to the source line connected to the neighboring unit cell, a voltage difference occurs between a drain and a source in a fourth unit cell D connected to the same source line. However, in the case of the fourth unit cell D, the voltage difference between the drain and the source is only 0.4V, so that data errors are not generated. That is, the random voltage is supplied to the neighboring unit cell through the source line while a datum is stored in a predetermined unit cell, thereby affecting more unit cells than in the conventional art. However, data errors are not generated in the neighboring unit cell.

Although the example where 0.4V or −0.4V is applied to the source line is described in an embodiment of the present invention, the range of the voltage applied to the source line in the same operating environment may be broader. That is, when a turn-on voltage of the gate is 0.8V, during the access of the specific unit cell, the range of the voltage applied to the source line connected to the neighboring unit cell ranges from 0V to 0.8V (or −0.8V to 0V). When a level of the voltage applied to the source line is 0.8V or higher, data distortion may be generated by a voltage difference between the source and the drain in the neighboring unit cell.

Out of characteristics of the unit cell of the semiconductor memory device, data retention time is determined based on the most inferior unit cell. In order to prevent generation of data distortion, the present invention distribute risk of error in the most inferior unit cell to several neighboring unit cells, thereby improving data retention time.

As described above, the disclosed semiconductor memory device does not share a source line connected to a unit cell using a floating body transistor applied to a high integrated semiconductor memory device, but connects the source line individually, thereby establishing the area of each unit cell to be less than $8F^2$ and also reducing data errors resulting from operating voltage change of neighboring word lines. While a plurality of active regions included in a cell array of a conventional semiconductor memory device are configured to have a zigzag pattern, a plurality of active regions included in a cell array of the disclosed semiconductor memory device can be arranged in the direction of both major axis and minor axis. As a result, one dummy word line can be obtained in each unit cell, thereby facilitating the manufacturing process of unit cells of $6F^2$.

The above embodiments of the present invention are illustrative and not limitative. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory (DRAM) device or non-volatile memory device. Other additions, subtractions, or modifications are obvious in view of the present disclosure and are intended to fall within the scope of the appended claims.

What is claimed is:

1. A semiconductor memory device, comprising plural active regions and a device isolation layer for separating each of the plural active regions from others, wherein the plural active regions stand in a row and column lines and each of the plural active regions includes two unit cells which hold a drain coupled to a bit line in common and sources of the two unit cells are respectively coupled to different source lines,
   wherein when data is stored in one of the two unit cells, a voltage is supplied to one of the source lines coupled to the other of the two unit cells, and
   wherein a predetermined level of the voltage is higher than a ground voltage and lower than a threshold voltage of the unit cell when the datum "1" is delivered through the bit line.

2. The semiconductor memory device according to claim 1, wherein the source lines are formed in the direction of a minor axis of the active region and the bit line is formed over the source lines in the direction of a major axis of the active region.

3. The semiconductor memory device according to claim 1, wherein the bit line is formed in the direction of a major axis of the active region and the source lines are formed in the direction of a minor axis of the active region.

4. The semiconductor memory device according to claim 1, wherein each unit cell includes a floating body transistor including a gate formed on the active region and source and drain formed in the active region through an ion-implantation process.

5. The semiconductor memory device according to claim 4, wherein the active region is formed in an upper silicon layer included in a silicon-on-insulator substrate, and the device isolation layer is connected to a buried insulating layer included in the silicon-on-insulator substrate.

6. The semiconductor memory device according to claim 1, wherein the unit cell has an area of $6F^2$.

7. The semiconductor memory device according to claim 1, further comprising a dummy word line between two neighboring active regions in the direction of a major axis of the active region.

8. A semiconductor memory device, comprising plural active regions and a device isolation layer for separating each of the plural active regions from others, wherein the plural active regions stand in row and column lines and each of the plural active regions includes two unit cells which hold a drain coupled to a bit line in common and sources of the two unit cells are respectively coupled to different source lines,
   wherein when data is stored in one of the two unit cells, a voltage is supplied to one of the source lines coupled to the other of the two unit cells, and
   wherein a predetermined level of the voltage is lower than a ground voltage and higher than a negative level of threshold voltage when the datum "0" is delivered through the bit line.

9. The semiconductor memory device according to claim 8, wherein the source lines are formed in the direction of a minor axis of the active region and the bit line is formed over the source lines in the direction of a major axis of the active region.

10. The semiconductor memory device according to claim 8, wherein the bit line is formed in the direction of a major axis of the active region and the source lines are formed in the direction of a minor axis of the active region.

11. The semiconductor memory device according to claim 8, wherein each unit cell includes a floating body transistor including a gate formed on the active region and source and drain formed in the active region through an ion-implantation process.

12. The semiconductor memory device according to claim 11, wherein the active region is formed in an upper silicon layer included in a silicon-on-insulator substrate, and the device isolation layer is connected to a buried insulating layer included in the silicon-on-insulator substrate.

13. The semiconductor memory device according to claim 8, wherein the unit cell has an area of $6F^2$.

14. The semiconductor memory device according to claim 8, further comprising a dummy word line between two neighboring active regions in the direction of a major axis of the active region.

* * * * *